(12) United States Patent  
Shao et al.

(10) Patent No.: US 12,550,312 B2  
(45) Date of Patent: Feb. 10, 2026

(54) THREE-DIMENSIONAL MEMORY AND FORMATION METHOD THEREOF

(71) Applicant: CHANGXIN MEMORY TECHNOLOGIES, INC., Hefei (CN)

(72) Inventors: Guangsu Shao, Hefei (CN); Deyuan Xiao, Hefei (CN); Yunsong Qiu, Hefei (CN); Weiping Bai, Hefei (CN); Yi Jiang, Hefei (CN); Xingsong Su, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 847 days.

(21) Appl. No.: 17/891,125

(22) Filed: Aug. 18, 2022

(65) Prior Publication Data

US 2023/0371231 A1    Nov. 16, 2023

Related U.S. Application Data

(63) Continuation of application No. PCT/CN2022/098851, filed on Jun. 15, 2022.

(30) Foreign Application Priority Data

May 10, 2022   (CN) .......................... 202210502920.8

(51) Int. Cl.  
*H10B 12/00*   (2023.01)  
(52) U.S. Cl.  
CPC .............. *H10B 12/05* (2023.02); *H10B 12/30* (2023.02)

(58) Field of Classification Search  
CPC .. H10B 12/30; H10B 12/488; H10D 30/6735; H10D 62/121  
See application file for complete search history.

(56) References Cited

U.S. PATENT DOCUMENTS

| | | | |
|---|---|---|---|
| 2012/0007167 A1* | 1/2012 | Hung | H10D 30/0413 257/E21.645 |
| 2019/0103407 A1* | 4/2019 | Kim | H10B 12/30 |
| 2022/0077151 A1* | 3/2022 | Lee | H10B 12/482 |

FOREIGN PATENT DOCUMENTS

CN             112750829 A       5/2021

* cited by examiner

*Primary Examiner* — Brian Turner  
(74) *Attorney, Agent, or Firm* — Kilpatrick Townsend & Stockton LLP

(57) ABSTRACT

A method for forming a three-dimensional memory provided by embodiments includes: forming a substrate and a stacked layer, where the stacked layer includes first semiconductor layers and second semiconductor layers alternately stacked, a thickness of the second semiconductor layers is D1, the first semiconductor layers include a plurality of channel regions as well as a first region and a second region arranged on opposite two sides of each of the plurality of channel regions along a first direction, and the first direction is a direction parallel to the top surface of the substrate; forming a plurality of first openings respectively exposing the plurality of channel regions, a gap between adjacent two of the plurality of first openings along a second direction has a width D2, D1>D2; and depositing a conductive layer along the plurality of first openings.

5 Claims, 12 Drawing Sheets

THREE-DIMENSIONAL MEMORY AND FORMATION METHOD THEREOF

CROSS-REFERENCE TO RELATED APPLICATION

This application is a continuation of PCT/CN2022/098851, filed on Jun. 15, 2022, which claims priority to Chinese Patent Application No. 202210502920.8, titled "THREE-DIMENSIONAL MEMORY AND FORMATION METHOD THEREOF" and filed on May 10, 2022, the entire contents of which are incorporated herein by reference.

TECHNICAL FIELD

The present disclosure relates to the field of semiconductor fabrication technology, and more particularly, to a three-dimensional memory and a formation method thereof.

BACKGROUND

As a semiconductor apparatus commonly used in electronic devices such as computers, Dynamic Random Access Memory (DRAM) comprises a plurality of memory cells, where each of the plurality of memory cells generally includes a transistor and a capacitor. The transistor has a gate electrically connected to a word line, a source electrically connected to a bit line, and a drain electrically connected to the capacitor. A word line voltage of the word line may control on or off of the transistor, such that data information stored in the capacitor can be read by means of the bit line or written into the capacitor.

With continuous miniaturization of a memory structure such as the DRAM, a greater challenge is posed to fabrication processes and yield of a three-dimensional memory. For example, with size miniaturization of the memory structure such as the DRAM, a vertical word line structure may cause a higher resistance of the memory, which has a negative effect on electrical properties of the memory.

Therefore, how to simplify the fabrication processes of the three-dimensional memory and increase the yield of the three-dimensional memory is a technical problem to be solved urgently at present.

SUMMARY

Some embodiments of the present disclosure provide a three-dimensional memory and a formation method thereof, to simplify fabrication processes the three-dimensional memory and increase yield of the three-dimensional memory.

According to some embodiments, the present disclosure provides a method of forming a three-dimensional memory, comprising the following steps of: forming a substrate and a stacked layer positioned on the substrate, the stacked layer comprising first semiconductor layers and second semiconductor layers alternately stacked along a direction perpendicular to a top surface of the substrate, each of the second semiconductor layers having a thickness of D1, each of the first semiconductor layers comprising a plurality of channel regions as well as a first region and a second region arranged on opposite two sides of each of the plurality of channel regions along a first direction, and the first direction being a direction parallel to the top surface of the substrate; forming, in the stacked layer, a plurality of first openings respectively exposing the plurality of channel regions, a gap between adjacent two of the plurality of first openings along a second direction having a width D2, D1>D2, and the second direction being a direction parallel to the top surface of the substrate and intersecting with the first direction; and depositing a conductive layer along the plurality of first openings by means of an atomic layer deposition process, the conductive layer wrapping the plurality of channel regions and filling the gap between adjacent two of the plurality of first openings along the second direction.

In some embodiments, the step of forming a substrate and a stacked layer positioned on the substrate comprises: forming the substrate; alternately depositing the first semiconductor layers and the second semiconductor layers on a surface of the substrate to form the stacked layer; etching the stacked layer to form a plurality of isolation trenches arranged in parallel along the second direction and penetrating through the stacked layer along the direction perpendicular to the top surface of the substrate, each of the plurality of isolation trenches dividing each of the first semiconductor layers into a plurality of active areas arranged in parallel along the second direction, and each of the plurality of active areas comprising the plurality of channel regions as well as the first regions and the second regions; and filling a first insulating material into the plurality of isolation trenches to form a spacer.

In some embodiments, before forming, in the stacked layer, a plurality of first openings respectively exposing the plurality of channel regions, the method further comprises: forming, in the second semiconductor layers, second openings for exposing the first regions and third openings for exposing the second regions; and forming filling layers to fill the second openings and the third openings.

In some embodiments, the step of the forming, in the second semiconductor layers, second openings for exposing the first regions and third openings for exposing the second regions comprises: etching the spacer to form first etching holes and second etching holes penetrating through the spacer along the direction perpendicular to the top surface of the substrate; and etching part of regions in the second semiconductor layers along the first etching holes and the second etching holes to form the second openings for exposing the first regions and the third openings for exposing the second regions.

In some embodiments, before forming filling layers to fill the second openings and the third openings, the method further comprises: rounding corners of the second openings and corners of the third openings.

In some embodiments, the step of forming filling layers to fill the second openings and the third openings comprises: filling a second insulating material into the second openings and the third openings to form the filling layers.

In some embodiments, before depositing a conductive layer along the plurality of first openings by means of an atomic layer deposition process, the method further comprises: oxidizing surfaces of the plurality of trench regions along the plurality of first openings to form a gate oxide layer.

In some embodiments, the step of depositing a conductive layer along the plurality of first openings by means of an atomic layer deposition process comprises: depositing a conductive material along the plurality of first openings by means of the atomic layer deposition process to form the conductive layer, the conductive layer comprising a plurality of first parts wrapping the gate oxide layer and second parts connected to the plurality of first parts and covering side walls of the filling layers, and any adjacent two of the plurality of first parts being connected along the second direction.

In some embodiments, after depositing a conductive layer along the plurality of first openings by means of the atomic layer deposition process, the method further comprises: removing the filling layers and the second parts of the conductive layer to form source regions in the first regions and drain regions in the second regions, the plurality of first parts connected along the second direction forming a word line.

In some embodiments, before removing the filling layers and the second parts of the conductive layer, the method further comprises: filling a third insulating material into the plurality of first openings at a top of the stacked layer to form a covering layer.

In some embodiments, the step of removing the filling layers and the second parts of the conductive layer comprises: removing the filling layers to expose the first regions and the second regions; and removing the second parts.

In some embodiments, the first regions and the second regions of the first semiconductor layers all comprise doping elements; and the removing the filling layers to expose the first regions and the second regions comprises: removing the filling layers, the exposed first regions forming the source regions, and the exposed second regions forming the drain regions.

In some embodiments, after removing the second parts, the method further comprises: reducing a thickness of the first regions and a thickness of the second regions; and forming the source regions on surfaces of the first regions, and forming the drain regions on surfaces of the second regions.

In some embodiments, the step of reducing a thickness of the first regions and a thickness of the second regions comprises: oxidizing the surfaces of the first regions and the surfaces of the second regions to form oxide layers; and removing the oxide layers.

According to some other embodiments, the present disclosure also provides a three-dimensional memory, comprising:
 a substrate;
 a stacked layer structure positioned on the substrate, the stacked layer structure comprising a plurality of first semiconductor layers arranged in parallel along a direction perpendicular to a top surface of the substrate, the plurality of first semiconductor layers comprising a plurality of active areas parallel to one another and arranged at intervals along a second direction, each of the plurality of active areas comprising channel regions extending along a first direction, both the first direction and the second direction being directions parallel to the top surface of the substrate, and the first direction intersecting with the second direction; and
 a plurality of word lines, the plurality of word lines being parallel to one another and arranged at intervals along the direction perpendicular to the top surface of the substrate, each of the plurality of word lines continuously wrapping all the channel regions in a given one of the plurality of first semiconductor layers, and each of the plurality of word lines extending along the second direction; wherein
 a spacing between every two of the plurality of active areas in the second direction is smaller than a spacing between the every two of the plurality of active areas in a vertical direction.

In some embodiments, the plurality of first semiconductor layers further comprise peripheral regions positioned outside the plurality of active areas. The stacked layer structure further comprises: second semiconductor layers positioned between the peripheral regions in adjacent two layers of the plurality of first semiconductor layers; and insulating dielectric layers positioned between the plurality of active areas in adjacent two layers of the plurality of first semiconductor layers.

In some embodiments, the three-dimensional memory further includes: a spacer positioned between adjacent two of the plurality of active areas in each of the plurality of first semiconductor layers, the spacer extending along a direction parallel to the first direction.

In some embodiments, each of the insulating dielectric layers further comprises an air gap positioned between adjacent two of the plurality of channel regions.

In some embodiments, the three-dimensional memory further comprises: source regions positioned in the plurality of active areas in the plurality of first semiconductor layers, the source regions extending along the first direction; and drain regions positioned in the plurality of active areas in the plurality of first semiconductor layers, the drain regions extending along the first direction, the source regions and the drain regions being arranged on opposite two sides of each of the plurality of channel regions along the first direction.

In some embodiments, the three-dimensional memory further comprises: source regions positioned on surfaces of the plurality of first semiconductor layers, projections of the source regions being positioned in the plurality of active areas along the direction perpendicular to the top surface of the substrate; and drain regions positioned on the surfaces of the plurality of first semiconductor layers, along the direction perpendicular to the top surface of the substrate, projections of the drain regions being positioned in the plurality of active areas, and the projections of the source regions and the projections of the drain regions being arranged on opposite two sides of each of the plurality of channel regions along the first direction.

According to the three-dimensional memory and the formation method thereof provided in some embodiments of the present disclosure, first semiconductor layers and second semiconductor layers are alternately stacked to form a stacked layer, then the stacked layer is etched to form a plurality of first openings that expose a plurality of channel regions in each of the first semiconductor layers, and a thickness of the second semiconductor layers is limited to be smaller than a width of a gap between adjacent two of the plurality of first openings in a horizontal direction, such that when conductive layers are deposited along the first openings by means of an atomic layer deposition process, the conductive layers in the plurality of first openings in the horizontal direction are connected into a line to form a horizontal word line structure. In this way, fabrication processes the three-dimensional memory are simplified, and fabrication yield the three-dimensional memory is increased. In addition, the horizontal word line structure also facilitates reducing a resistance of the three-dimensional memory, thereby improving electrical properties of the three-dimensional memory.

DETAILED DESCRIPTION

Embodiments of a three-dimensional memory and a formation method thereof provided by the present disclosure are described in detail below with reference to the accompanying drawings.

Figure 1:
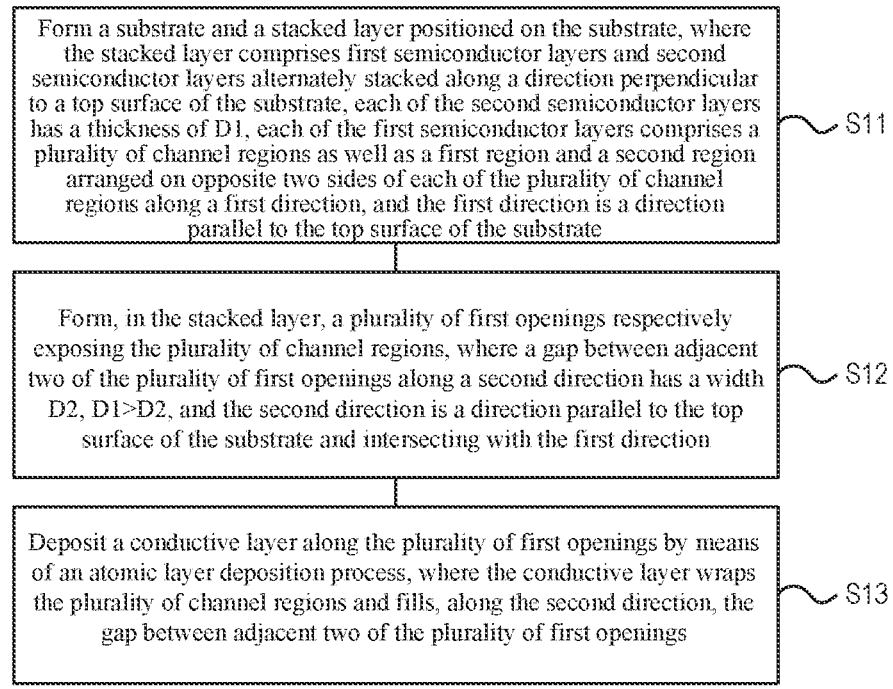
FIG. 1 is a flowchart of a method for forming a three-dimensional memory according to an embodiment of the present disclosure.
Figure 2A:
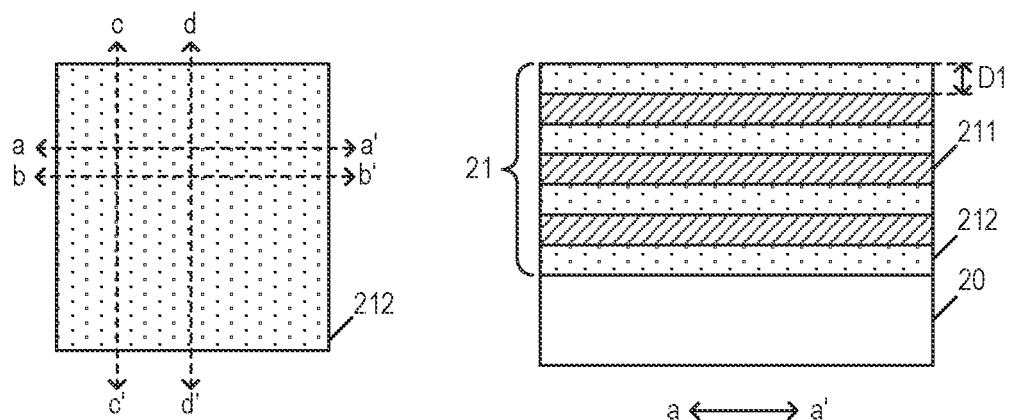
FIGS. 2A-2Q are schematic diagrams showing main processes in the process of forming the three-dimensional memory according to embodiments of the present disclosure.
Figure 2A:
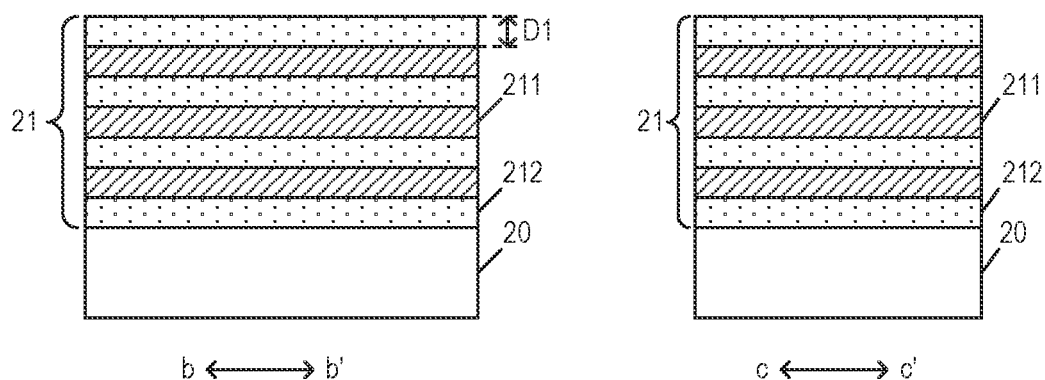

This embodiment provides a method for forming a three-dimensional memory. FIG. 1 is a flowchart of the method for forming a three-dimensional memory according to an embodiment of the present disclosure. FIGS. 2A-2Q are schematic diagrams showing main processes in the process of forming the three-dimensional memory according to embodiments of the present disclosure. The three-dimensional memory in this embodiment may be, but not limited to, a dynamic random access memory (DRAM). FIGS. 2A to 2Q illustrate schematic top views showing main processes in the process of forming the three-dimensional memory, and schematic cross-sectional views of the schematic top views in an a-a' direction, a b-b' direction, a c-c' direction and a d-d' direction, to clearly indicate the processes for forming the three-dimensional memory. As shown in FIG. 1 and FIGS. 2A to 2Q, the method for forming a three-dimensional memory includes following steps.

In Step S11, there are formed a substrate 20 and a stacked layer 21 positioned on the substrate 20, the stacked layer 21 comprises first semiconductor layers 211 and second semiconductor layers 212 alternately stacked along a direction perpendicular to a top surface of the substrate 20, each of the second semiconductor layers 212 has a thickness of D1, and each of the first semiconductor layers 211 comprises a plurality of channel regions as well as a first region and a second region arranged on opposite two sides of each of the plurality of channel regions along a first direction a-a', where the first direction a-a' is a direction parallel to the top surface of the substrate 20, as shown in FIG. 2A.

In some embodiments, the substrate 20 may be, but is not limited to, a silicon substrate. This embodiment is described by taking an example where the substrate 20 is a silicon substrate. In other examples, the substrate 20 may be a semiconductor substrate such as gallium nitride, gallium arsenide, gallium carbide, silicon carbide, or silicon on insulator (SOI). The substrate 20 is configured to support device structures thereon. The first semiconductor layers 211 and the second semiconductor layers 212 may be alternately deposited along the direction perpendicular to the top surface (i.e., a surface of the substrate 20 configured to form the stacked layer 21) of the substrate 20 by means of an epitaxial growth process, to form the stacked layer 21 having a superlattice stack structure. Number of the first semiconductor layers 211 and the second semiconductor layers 212 alternately stacked in the stacked layer 21 may be selected by those skilled in the art according to actual requirements. The greater the number of layers in the stacked layer 21 is, the larger a storage region capacity of the three-dimensional memory has. An etching selectivity between each of the first semiconductor layers 211 and each of the second semiconductor layers 212 should be greater than 3, to subsequently expose the first regions, the second regions, and the channel regions by means of selective etching. In one embodiment, a material of the first semiconductor layers 211 may be Si, and a material of the second semiconductor layers 212 may be SiGe.

Figure 2B:
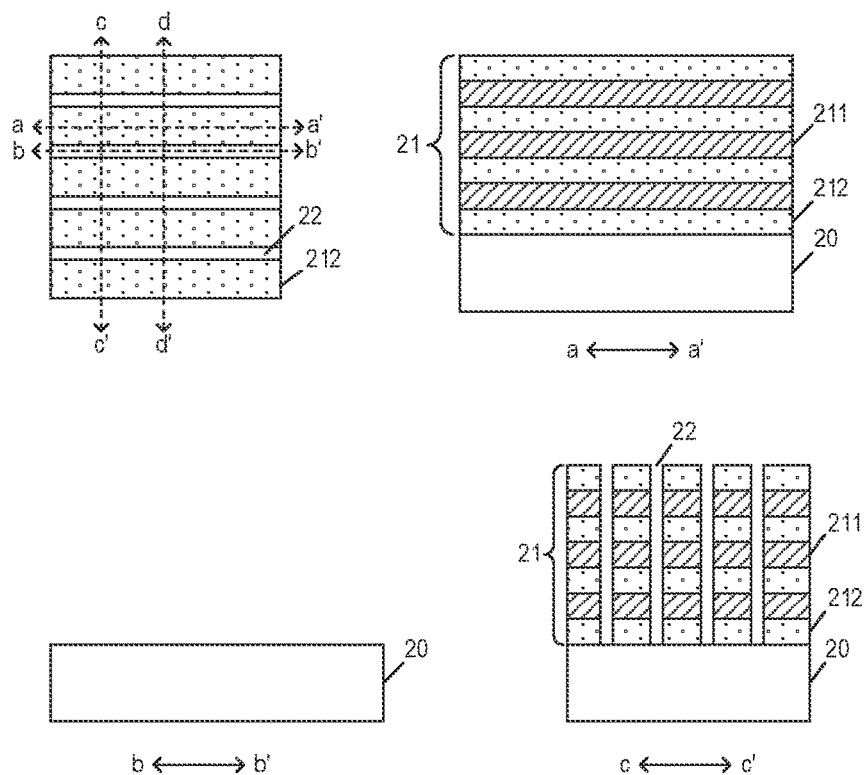
Figure 2C:
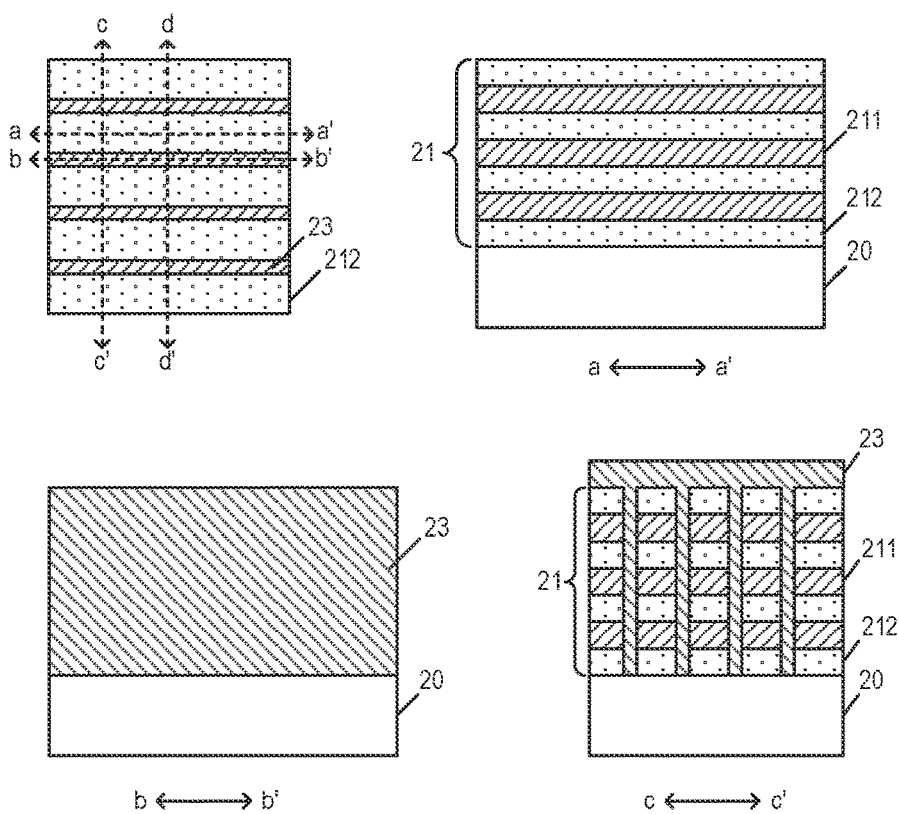
Figure 2D:
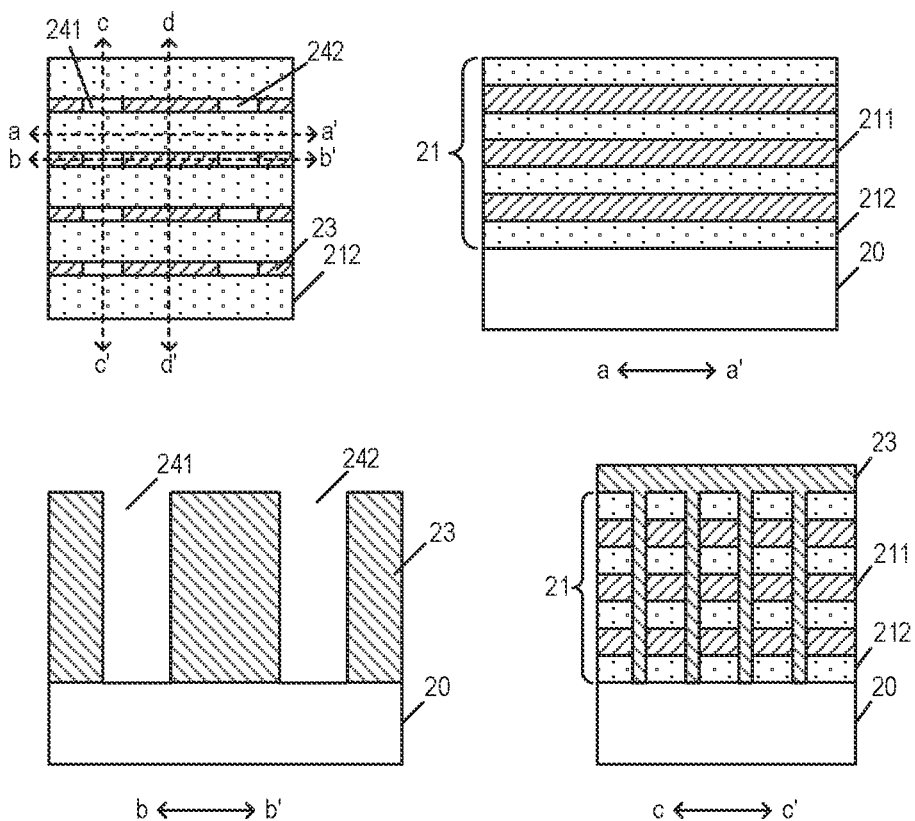
Figure 2E:
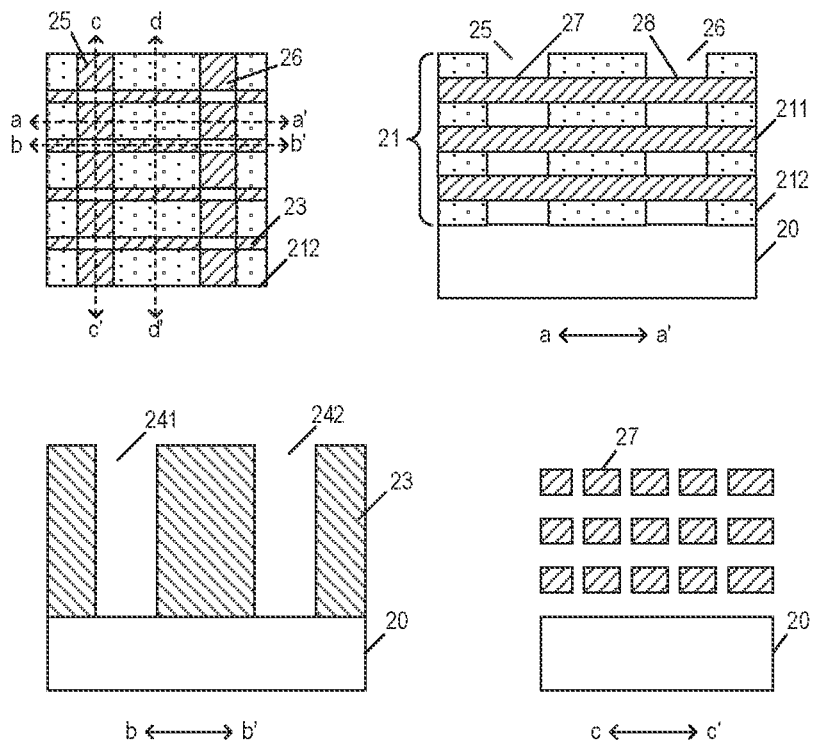
Figure 2F:
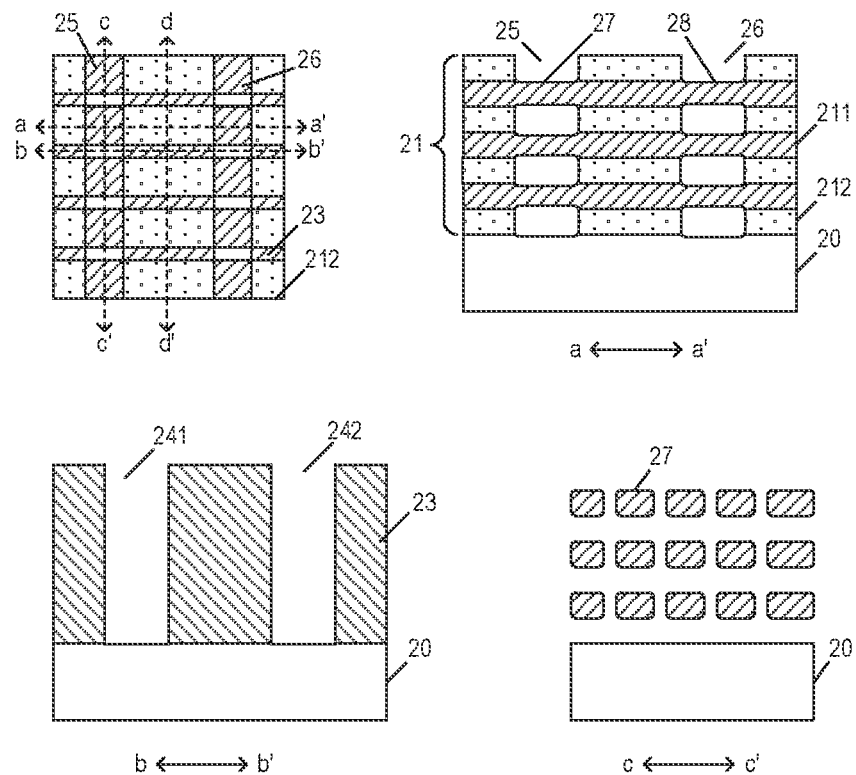
Figure 2G:
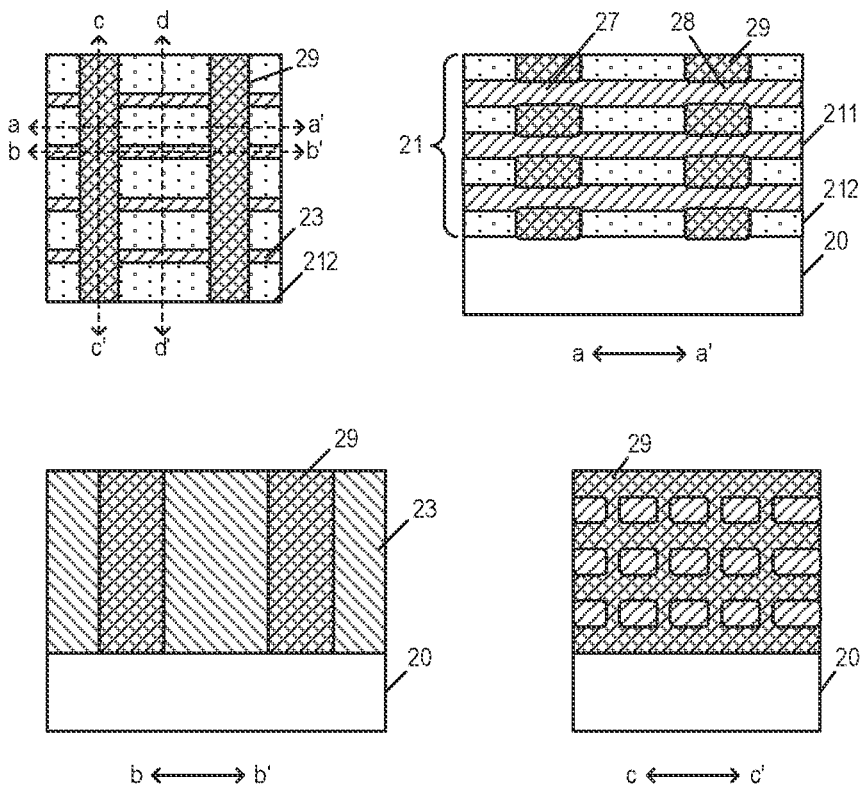

In some embodiments, the step of forming the substrate 20 and the stacked layer 21 on the substrate 20 includes:
forming the substrate 20;
alternately depositing the first semiconductor layers 211 and the second semiconductor layers 212 on the surface of the substrate 20 to form the stacked layer 21, as shown in FIG. 2A;
etching the stacked layer 21 to form a plurality of isolation trenches 22 arranged in parallel along the second direction d-d' and penetrating through the stacked layer 21 along the direction perpendicular to the top surface of the substrate 20, as shown in FIG. 2B, where each of the plurality of isolation trenches 22 divides each of the first semiconductor layers 211 into a plurality of active areas arranged in parallel along the second direction d-d', and each of the plurality of active areas comprises the plurality of channel regions as well as the first regions and the second regions; and
filling a first insulating material into the plurality of isolation trenches 21 to form a spacer 23, as shown in FIG. 2C.

In some embodiments, after the stacked layer 21 is formed, the stacked layer 21 may be etched by means of a dry etching process along the direction perpendicular to the top surface of the substrate 20, to form a plurality of isolation trenches 22 penetrating through the stacked layer 21. Each of the isolation trenches 22 divides each of the first semiconductor layers 211 into a plurality of active areas arranged in parallel along the second direction d-d', and each of the active areas includes the channel regions arranged along the first direction a-a', the first regions, and the second regions. Next, a first insulating material such as an oxide (e.g., silicon dioxide) may be deposited in the isolation trenches 21 by means of a chemical vapor deposition process, a physical vapor deposition process or an atomic layer deposition process, to form the spacer 23 filling up the isolation trenches 21. The spacer 23 is configured to electrically isolate adjacent two of the active areas.

Figure 2H:
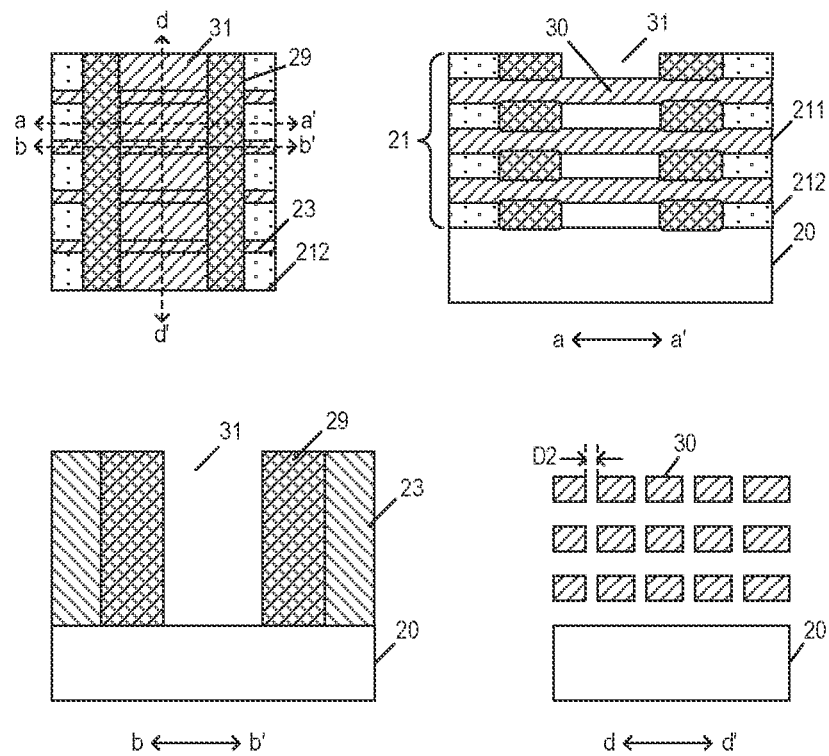
Figure 2I:
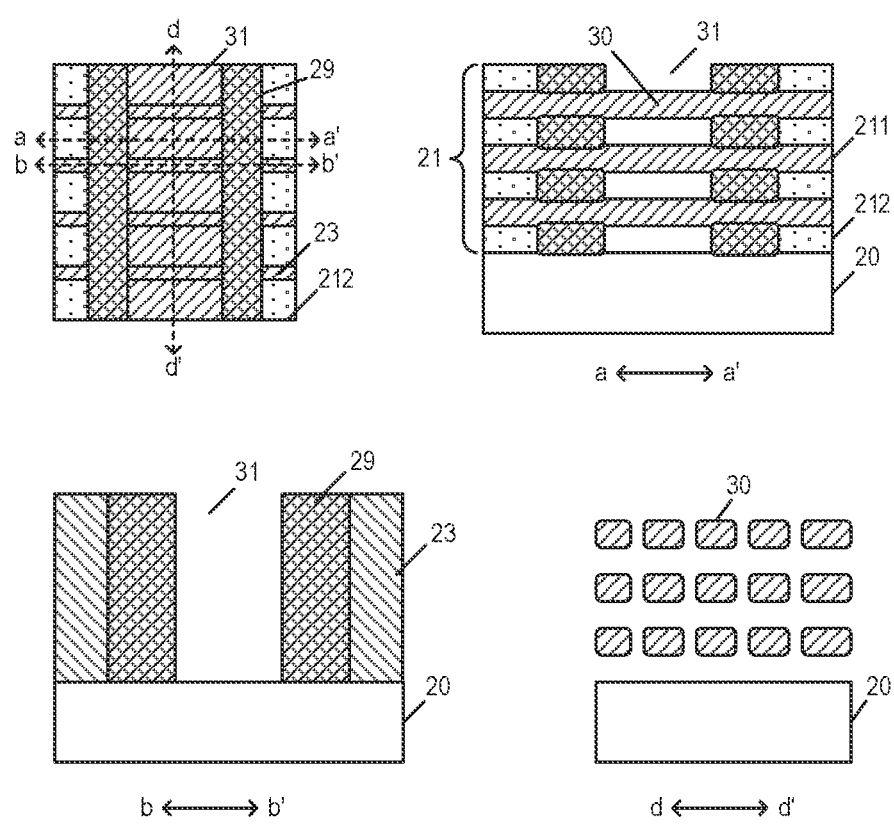
Figure 2J:
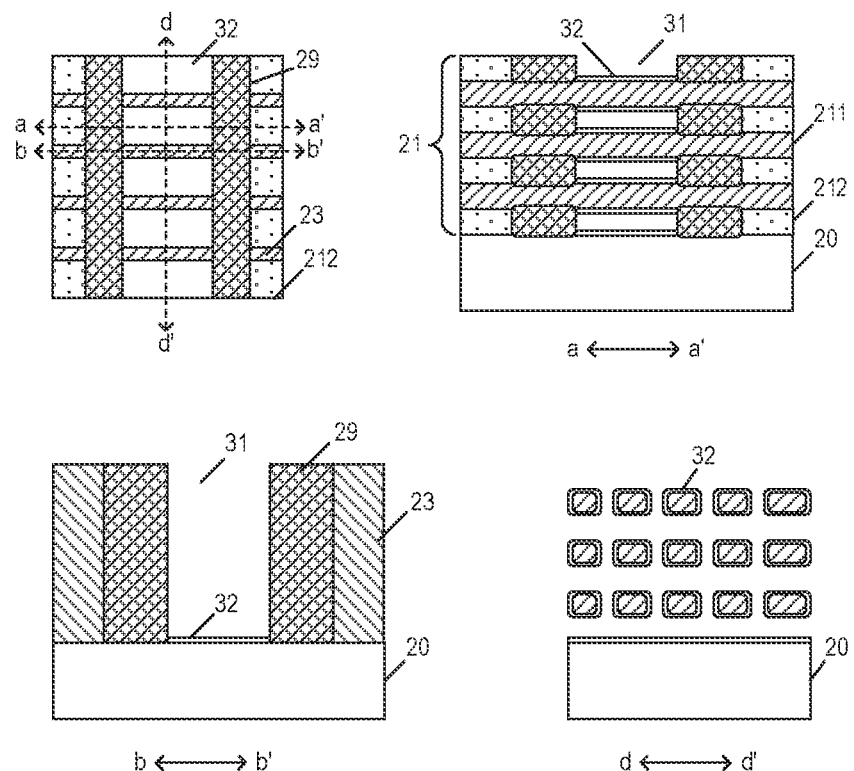

In Step S12, a plurality of first openings 31 respectively exposing the plurality of channel regions 30 are formed in the stacked layer 21, and a gap between adjacent two of the plurality of first openings 31 along a second direction d-d' has a width D2, D1>D2, where the second direction d-d' is a direction parallel to the top surface of the substrate 20 and intersecting with the first direction a-a', as shown in FIG. 2H.

In some embodiments, before forming, in the stacked layer 21, a plurality of first openings 31 respectively exposing the plurality of channel regions 30, the method further comprises:
forming, in the second semiconductor layers 212, second openings 25 for exposing the first regions 27 and third openings 26 for exposing the second regions 28, as shown in FIG. 2E; and
forming filling layers 29 to fill the second openings 25 and the third openings 26, as shown in FIG. 2G.

In some embodiments, the step of forming, in the second semiconductor layers 212, second openings 25 for exposing the first regions 27 and third openings 26 for exposing the second regions 28 includes:
etching the spacer 23 to form first etching holes 241 and second etching holes 242 penetrating through the spacer 23 along the direction perpendicular to the top surface of the substrate 20, as shown in FIG. 2D; and
etching part of regions in the second semiconductor layers 212 along the first etching holes 241 and the second etching holes 242 to form the second openings 25 for exposing the first regions 27 and the third openings 26 for exposing the second regions 28, as shown in FIG. 2E.

In some embodiments, the spacer 23 extends along the third direction b-b', and the third direction b-b' is parallel to the first direction a-a' and intersects with the second direction d-d'. The intersection as mentioned in this embodiment may be vertical intersection or oblique intersection. In an embodiment, to simplify the fabrication processes, the intersection is the vertical intersection. After the spacer 23 is formed, the spacer 23 may be etched downwards by means of the dry etching process along the direction perpendicular to the top surface of the substrate 20, to form, in the spacer 23, the first etching holes 241 and the second etching holes 242 penetrating through the spacer 23 along the direction perpendicular to the top surface of the substrate 20, as shown in FIG. 2D. Next, part of regions in the second semiconductor layers 212 may be etched along the first etching holes 241 and the second etching holes 242 by means of the wet etching process, to form, in each of the second semiconductor layers 212, the second openings 25 for exposing the first regions 27 and the third openings 26 for exposing the second regions 28, as shown in FIG. 2E. The exposed first regions 27 are configured to form source regions of transistors, and the exposed second regions 28 are configured to form drain regions of the transistors.

To increase a contact area between the filling layers 29 formed subsequently and the stacked layer 21 and to reduce defects caused by corner voids, in some embodiments, before forming filling layers to fill the second openings 25 and the third openings 26, the method further comprises:
rounding corners of the second openings 25 and corners of the third openings 26, as shown in FIG. 2F.

In some embodiments, the step of forming filling layers 29 to fill the second openings 25 and the third openings 26 includes:
filling a second insulating material into the second openings 25 and the third openings 26 to form the filling layers 29.

In some embodiments, after rounding corners of the second openings 25 and corners of the third openings 26, the second insulating material may be deposited in the second openings 25 and the third openings 26 by means of the atomic layer deposition process, to form the filling layers 29 filling up the second openings 25 and the third openings 26. The second insulating material may be, but not limited to, a nitride (such as silicon nitride) material. According to this embodiment, before forming the first openings 31 for exposing the channel regions 30, the second openings 25 and the third openings 26 are filled by the filling layers 29. In one aspect, the first regions and the second regions can be protected to prevent the process of exposing the channel regions 30 from causing damage to the first regions or the second regions. In another aspect, the filling layers 29 can also support the stacked layer 21, to prevent the stacked layer 21 from falling or collapsing in the process of exposing the channel regions 30.

After the filling layers 29 are formed, part of the second semiconductor layers 212 in the stacked layer 21 and part of the spacer 23 are etched to form a plurality of first openings 31 respectively exposing the plurality of channel regions 30, and a gap between adjacent two of the plurality of first openings 31 along the second direction d-d' has a width D2, D1>D2, where the second direction d-d' is a direction parallel to the top surface of the substrate 20 and intersecting with the first direction a-a', as shown in FIG. 2H. According to this embodiment, the gap between the adjacent two first openings 31 along the second direction d-d' is controlled to have a width of D2, and D1>D2, such that when the conductive layers are subsequently deposited in the first openings 31, the conductive layers in the plurality of first openings 31 parallel to one another and arranged at intervals along the second direction d-d' are first connected into a line, and then the conductive layers in the plurality of first openings 31 parallel to one another and arranged at intervals along the direction perpendicular to the top surface of the substrate 20 are connected into a line, such that a horizontal word line structure can be finally formed.

Figure 2K:
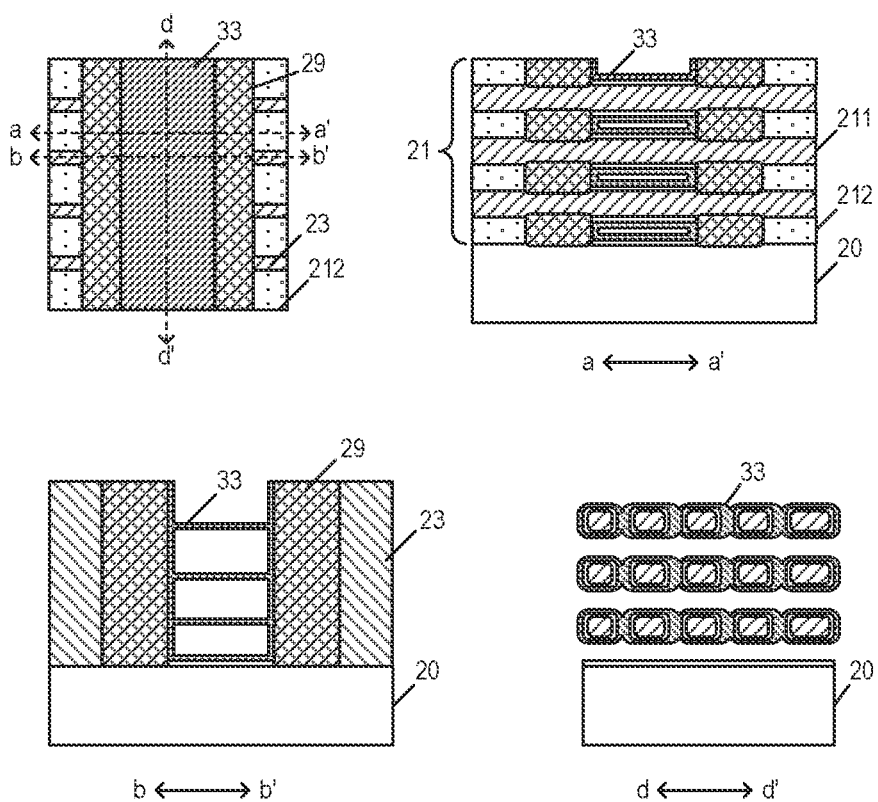
Figure 2L:
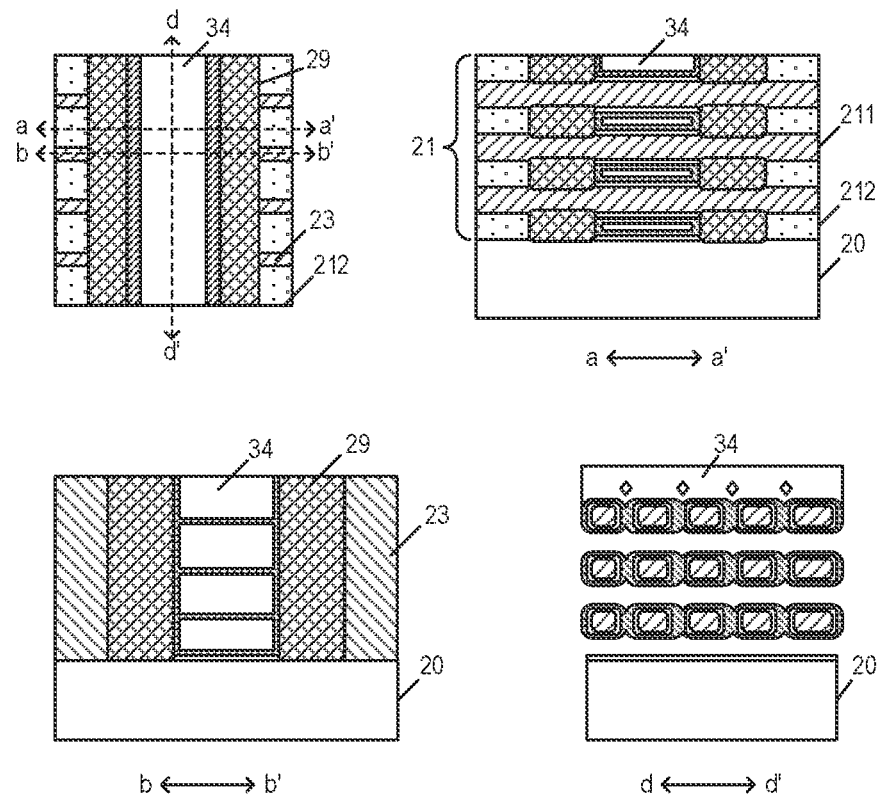
Figure 2M:
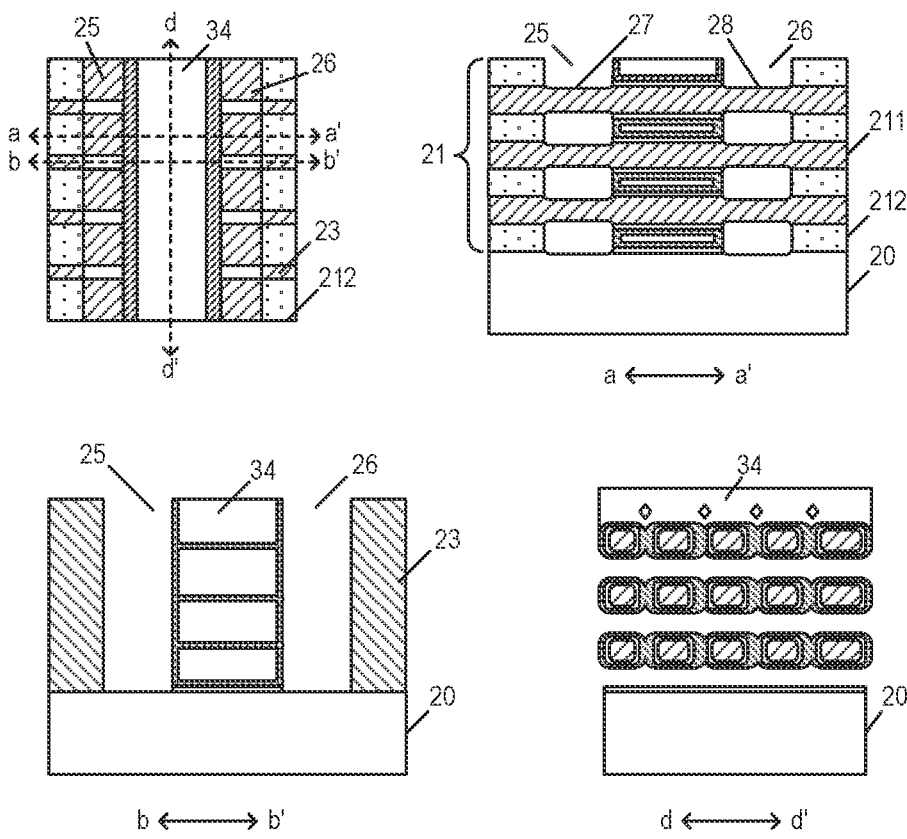

In Step S13, a conductive layer 33 is deposited along the plurality of first openings 31 by means of an atomic layer deposition process, where the conductive layer 33 wraps the plurality of channel regions 30 and fills the gap between adjacent two of the plurality of first openings 31 along the second direction d-d', as shown in FIG. 2K.

In some embodiments, before depositing the conductive layer 33 along the plurality of first openings 31 by means of an atomic layer deposition process, the method further comprises:
oxidizing surfaces of the plurality of trench regions 30 along the plurality of first openings 31 to form a gate oxide layer 32, as shown in FIG. 2J.

In some embodiments, after the first openings 31 exposing the channel regions 30 are formed, the corners of the first openings 31 are rounded, as shown in FIG. 2I, to increase a contact area between a material subsequently deposited in the first openings 31 and inner walls of the first openings 31, thereby reducing defects of the corners of the first openings. Next, the surfaces of the channel regions 30 may be oxidized in situ by means of thermal oxidation, to form the gate oxide layers 32, as shown in FIG. 2J.

In some embodiments, the step of depositing the conductive layer 33 along the plurality of first openings 31 by means of an atomic layer deposition process includes:
depositing a conductive material along the plurality of first openings 31 by means of the atomic layer deposition process to form the gate oxide layers 32, where the gate oxide layers 32 comprises a plurality of first parts wrapping the gate oxide layers 32 and second parts connected to the plurality of first parts and covering side walls of the filling layers 29, and any adjacent two of the plurality of first parts are connected along the second direction d-d', as shown in FIG. 2K.

Figure 2N:
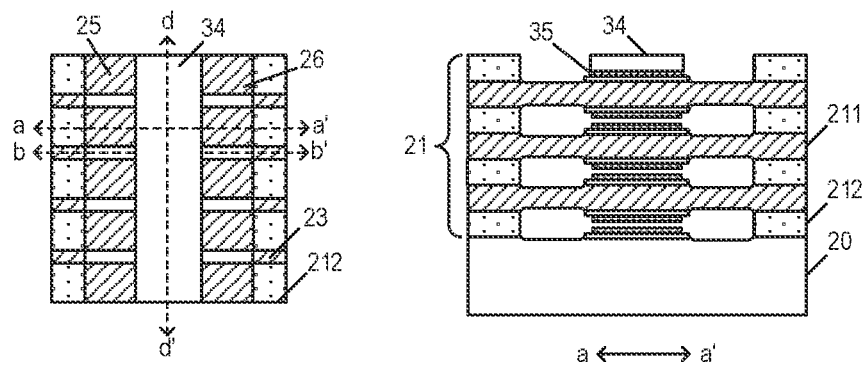
Figure 2N:
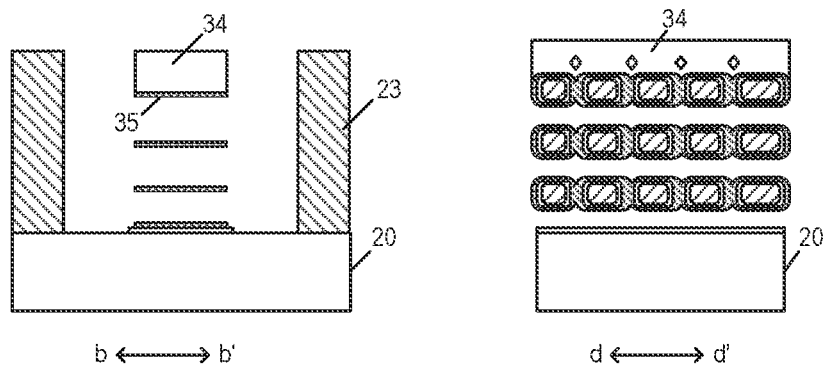

In some embodiments, after depositing the gate oxide layers 32 along the plurality of first openings 31 by means of the atomic layer deposition process, the method further comprises:
removing the filling layers 29 and the second parts of the gate oxide layers 32 to form source regions in the first regions 27 and drain regions in the second regions 28, where the plurality of first parts connected along the second direction d-d' form a word line, as shown in FIG. 2N.

In some embodiments, before removing the filling layers 29 and the second parts of the gate oxide layers 32, the method further comprises:
filling a third insulating material into the plurality of first openings 31 at a top of the stacked layer 21 to form a covering layer 34, as shown in FIG. 2L.

In some embodiments, the step of removing the filling layers 29 and the second parts of the gate oxide layers 32 comprises:

removing the filling layers 29 to expose the first regions 27 and the second regions 28, as shown in FIG. 2M; and removing the second parts, as shown in FIG. 2N.

In some embodiments, when a conductive material such as tungsten is deposited along the first openings 31 by means of the atomic layer deposition process, the width of the gap between adjacent two of the first openings 31 along the second direction d-d' is smaller than the thickness of the second semiconductor layers 212. Therefore, when the conductive layers 33 are deposited in the first openings 31, the conductive layers 33 in the plurality of first openings 31 parallel to one another and arranged at intervals along the second direction d-d' are first connected into a line, and then the conductive layers 33 in the plurality of first openings 31 parallel to one another and arranged at intervals along the direction perpendicular to the top surface of the substrate 20 are connected into a line. The conductive layers 33 include first parts wrapping the gate oxide layers 32 and second parts connected to the first parts and covering side walls of the filling layers 29. Next, a third insulating material (such as silicon dioxide) is deposited in the first openings 31 at the top of the stacked layer 21, to form a covering layer 34 filling up the first openings 31 at the top of the stacked layer 21; and the covering layer 34 remained on the top surface of the stacked layer 21 is removed by means of a chemical mechanical polishing process to form a structure as shown in FIG. 2L. The covering layer 34 is configured to isolate the conductive layers 33 from an external environment to protect the conductive layers 33.

After the covering layer 34 is formed, the filling layers 29 are removed by means of a selective etching process to expose the first regions 27 and the second regions 28, as shown in FIG. 2M, to subsequently form the transistors and etch the second parts of the conductive layers 33. Next, the second parts are completely removed by etching along the direction perpendicular to the top surface of the substrate 20, and only the first parts are retained. Along the direction perpendicular to the top surface of the substrate 20, the conductive layers 33 covering the surfaces of adjacent two layers of the channel regions 30 are not connected; and along the second direction d-d', the plurality of first parts covering the surface of each of the first semiconductor layers 211 are connected to form a word line 35, that is, the horizontal word line structure is formed, as shown in FIG. 2N. According to this embodiment, the horizontal word line structure not only has simple formation processes, but also can avoid yield and process challenges caused by the size miniaturization of the three-dimensional memory, and facilitates reducing the contact resistance of the three-dimensional memory.

To prevent the source regions and drain regions of the transistors from contacting the word line 35, when the second parts are removed by etching, a portion of the first parts may also be removed synchronously, such that after etching, the gate oxide layers 32 protrude from a remaining portion of first parts along the first direction a-a'. That is, along the direction perpendicular to the top surface of the substrate 20, projections of the remaining first parts are completely positioned within projections of the gate oxide layers 32 in contact with the remaining first parts.

In some embodiments, both the first regions 27 and the second regions 28 of the first semiconductor layers 211 include doping elements; and the step of removing the filling layers 29 to expose the first regions 27 and the second regions 28 comprises:

removing the filling layers 27, the exposed first regions 27 forming the source regions, and the exposed second regions 28 forming the drain regions.

Figure 2O:
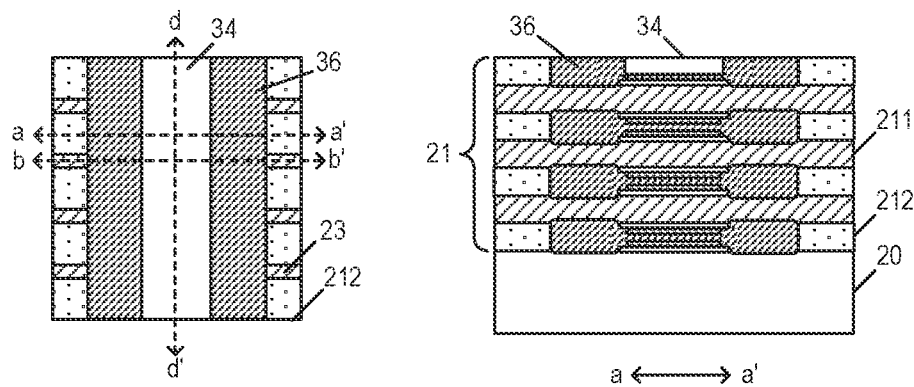
Figure 2O:
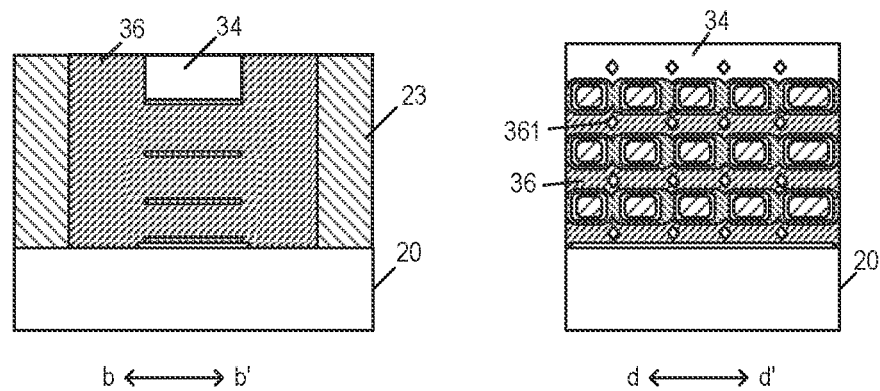

In some embodiments, during epitaxial growth of the first semiconductor layers 211, the first regions 27 and the second regions 28 in the first semiconductor layers 211 may be first doped. That is, when forming the stacked layer 21, the source regions and the drain regions are formed. After the filling layers 27 are removed, the source regions and the drain regions are directly exposed. Next, an insulating material such as an oxide (e.g., silicon dioxide) is deposited into the second openings 25 and the third openings 26 to form an insulating dielectric layer 36, as shown in FIG. 2O.

In another embodiment, after the second parts are removed, the method further includes:

reducing the thickness of the first region 27 and the thickness of the second region 28; and forming the source region on the surface of the first region 27, and forming the drain region on the surface of the second region 28.

In some embodiments, the step of reducing the thickness of the first region 27 and the thickness of the second region 28 includes:

oxidizing the surface of the first region 27 and the surface of the second region 28 to form oxide layers; and removing the oxide layers.

Figure 2P:
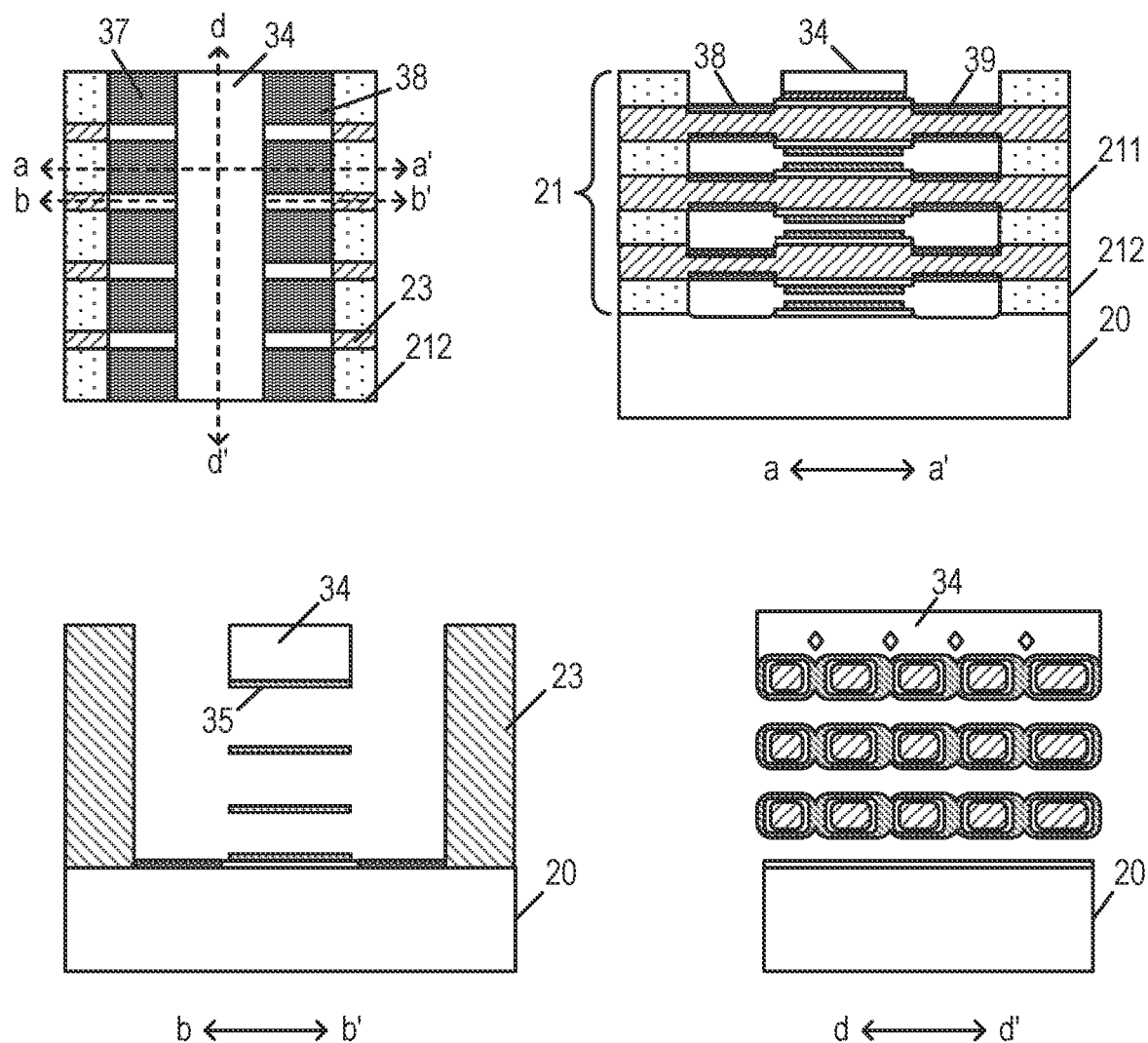
Figure 2Q:
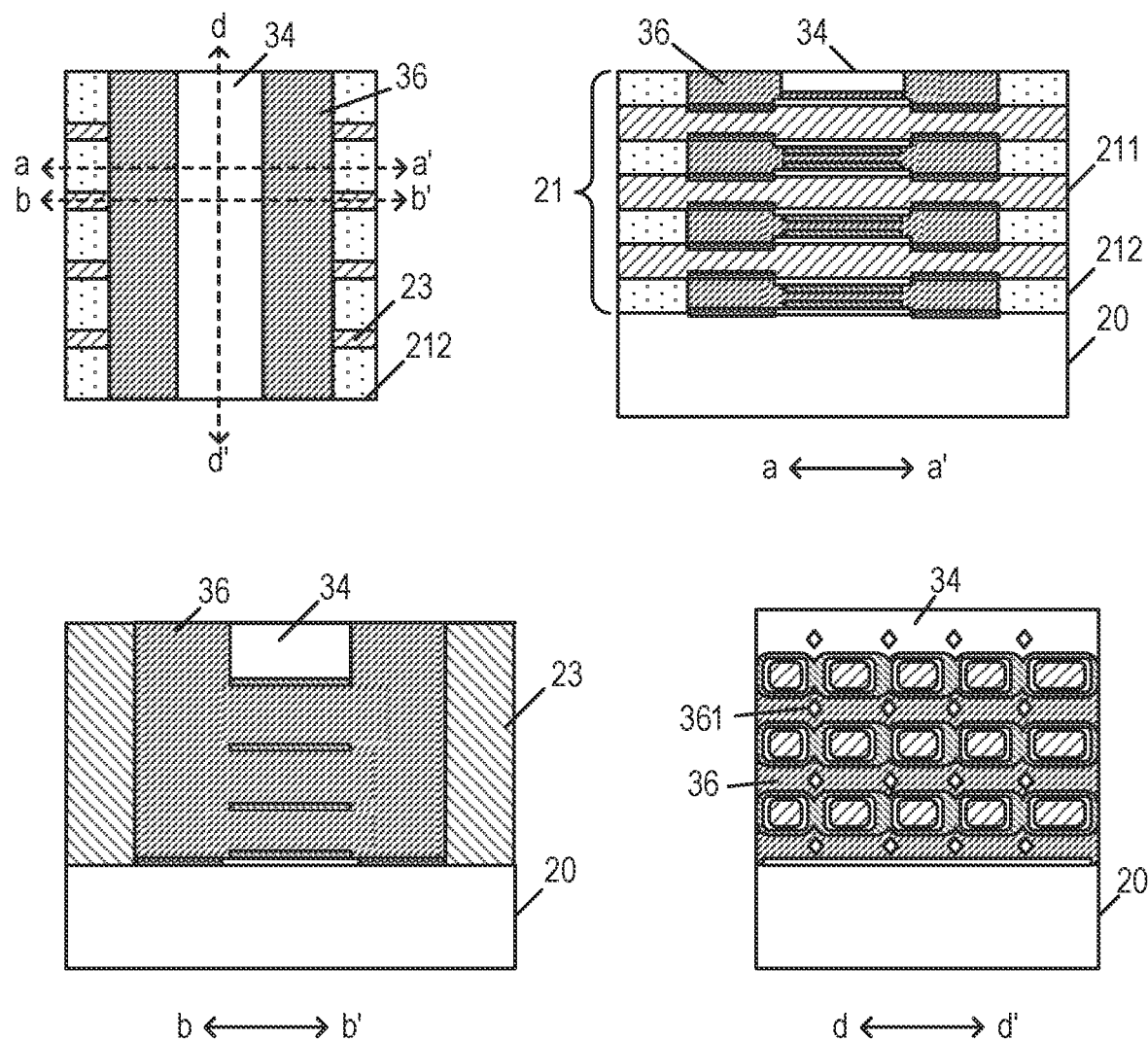

In some embodiments, during epitaxial growth of the first semiconductor layers 211, the first regions 27 and the second regions 28 in the first semiconductor layers 211 may be not doped first. After the second parts of the conductive layers 33 are removed, the surfaces of the first regions 27 and the surfaces of the second regions 28 may be oxidized by means of an in-situ oxidation process to form the oxide layers. Next, the oxide layers may be removed by means of a selective etching process, such that the thickness of the first regions 27 and the thickness of the second regions 28 are reduced along the direction perpendicular to the substrate 20, to increase mobility of electrons in the transistors. Next, a material such as silicon epitaxially grows on the surfaces of the remaining first regions 27 and the surfaces of the remaining second regions 28 to form epitaxial layers, and the epitaxial layers are doped to form the source regions 38 and the drain regions 39, as shown in FIG. 2P. Next, an insulating material such as an oxide (for example, silicon dioxide) is deposited into the second openings 25 and the third openings 26 to form an insulating dielectric layer 36, as shown in FIG. 2Q.

Figure 3:
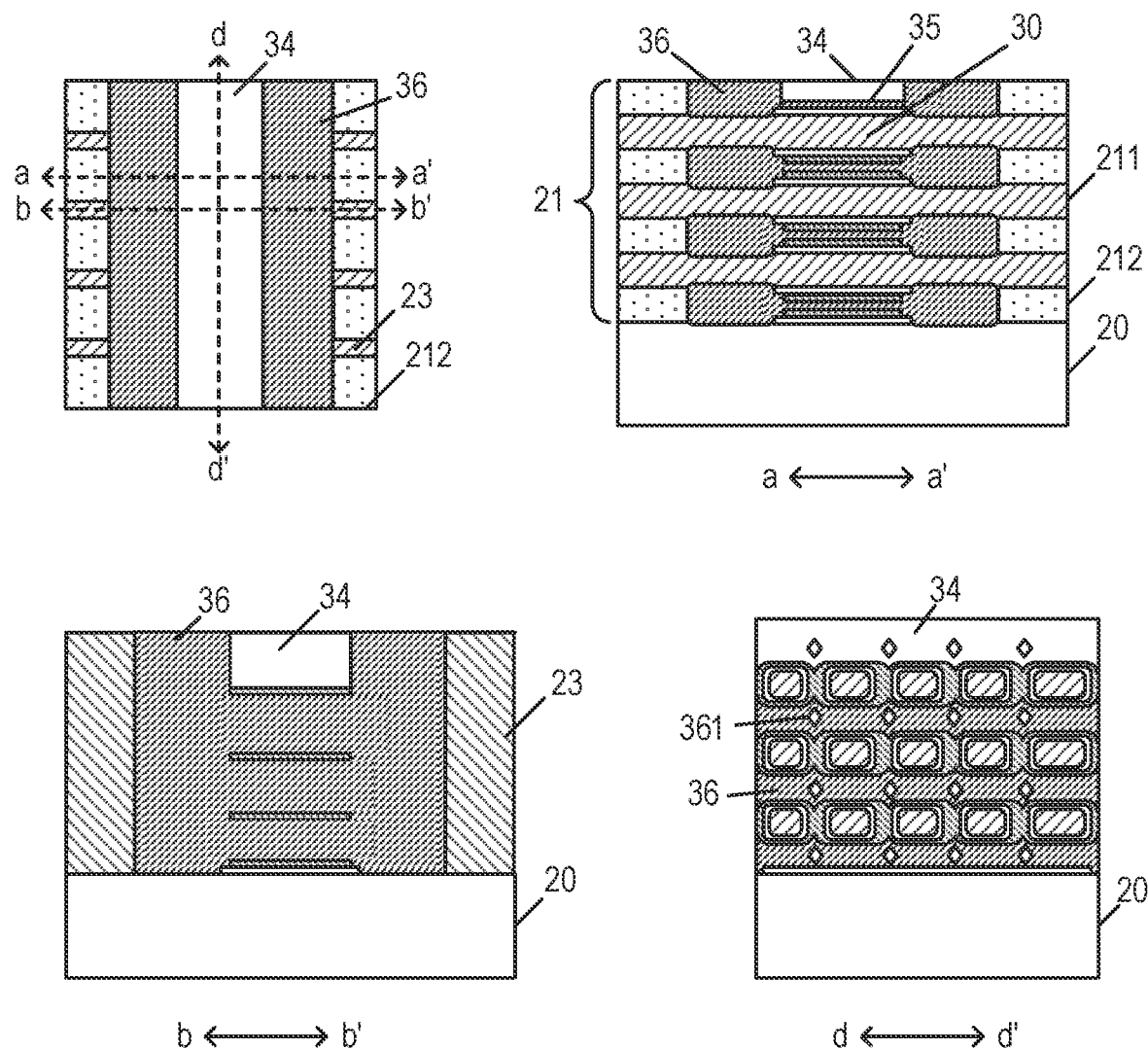
FIG. 3 is a schematic structural diagram of a three-dimensional memory according to an embodiment of the present disclosure.
Figure 4:
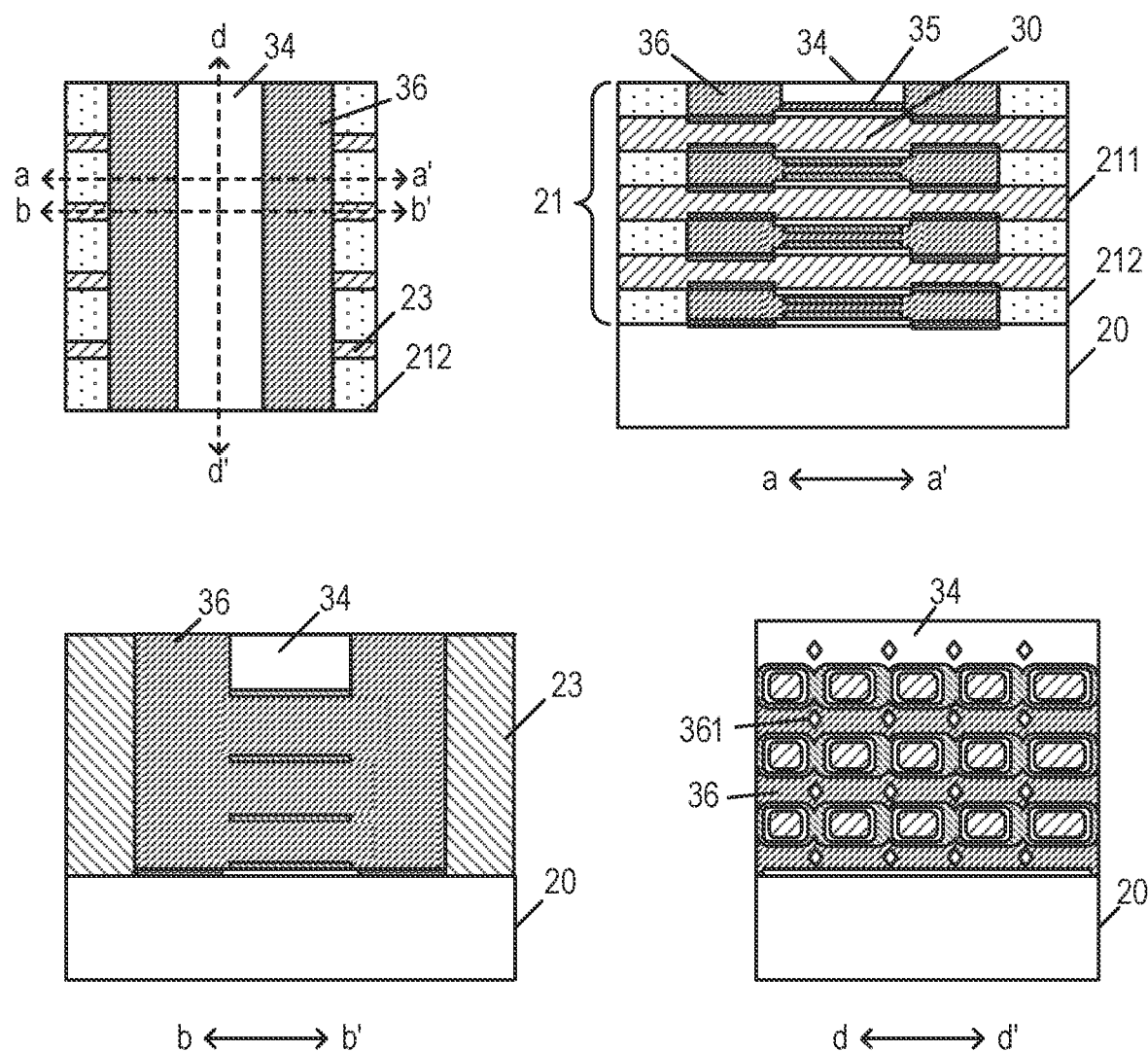
FIG. 4 is a schematic structural diagram of another three-dimensional memory according to an embodiment of the present disclosure.

This embodiment also provides a three-dimensional memory. FIG. 3 is a schematic structural diagram of a three-dimensional memory according to an embodiment of the present disclosure; and FIG. 4 is a schematic structural diagram of another three-dimensional memory according to an embodiment of the present disclosure. The three-dimensional memory provided by this embodiment may be formed by using the method for forming a memory as shown in FIG. 1 and FIGS. 2A to 2Q. The three-dimensional memory in this embodiment may be, but not limited to, a dynamic random access memory (DRAM). As shown in FIGS. 2A to 2Q, FIG. 3 and FIG. 4, the three-dimensional memory includes:

a substrate 20;

a stacked layer structure positioned on the substrate 20, where the stacked layer structure comprises a plurality of first semiconductor layers 211 arranged in parallel along a direction perpendicular to a top surface of the substrate 20, the plurality of first semiconductor layers 211 comprise a plurality of active areas parallel to one another and arranged at intervals along a second direction d-d', each of the plurality of active areas comprises channel regions 30 extending along a first direction a-a', both the first direction a-a' and the second direction d-d' are directions parallel to the top surface of the substrate 20, and the first direction a-a' intersects with the second direction d-d'; and a plurality of word lines 35, where the plurality of word lines 35 are parallel to one another and are arranged at intervals along the direction perpendicular to the top surface of the substrate 20, each of the plurality of word lines 35 continuously wrap all the channel regions 30 in one of the plurality of first semiconductor layers 211, and each of the plurality of word lines 35 extends along the second direction d-d'.

A spacing between the active areas in the second direction d-d' is smaller than a spacing between the active areas in a vertical direction.

In some embodiments, the spacing between adjacent two of the channel regions 30 along the second direction d-d' is smaller than the spacing between adjacent two of the channel regions 30 along the direction perpendicular to the top surface of the substrate 20.

In some embodiments, the first semiconductor layers 211 further includes peripheral regions positioned outside the active areas; and the stacked structure further includes:

second semiconductor layers 212 positioned between the peripheral regions in adjacent two layers of the first semiconductor layers 211; and insulating dielectric layers 36 positioned between the active areas in adjacent two layers of the first semiconductor layers 211.

In some embodiments, the three-dimensional memory further includes: a spacer positioned between adjacent two of the active areas in each of the plurality of first semiconductor layers 211, and the spacer extends along a direction parallel to the first direction a-a'.

In some embodiments, each of the insulating dielectric layers 36 further comprises an air gap 361 positioned between adjacent two of the plurality of channel regions 30.

In some embodiments, the three-dimensional memory further includes:

source regions positioned in the active areas of the first semiconductor layers 211, where the source regions extend along the first direction a-a'; and drain regions positioned in the active areas of the first semiconductor layers 211, where the drain regions extend along the first direction a-a', and the source regions and the drain regions are arranged on opposite two sides of each of the channel regions 30 along the first direction a-a'.

In some other embodiments, the three-dimensional memory further includes:

source regions 38 positioned on surfaces of the first semiconductor layers 211, where projections of the source regions 38 are positioned in the active areas along the direction perpendicular to the top surface of the substrate 20; and drain regions 39 positioned on the surfaces of the first semiconductor layers 211, where along the direction perpendicular to the top surface of the substrate 20, projections of the drain regions 39 are positioned in the active areas, and the projections of the source regions 38 and the projections of the drain regions 39 are arranged on opposite two sides of each of the channel regions 30 along the first direction a-a'.

According to the three-dimensional memory and the formation method thereof provided in this embodiment of the present disclosure, first semiconductor layers and second semiconductor layers are alternately stacked to form a stacked layer, then the stacked layer is etched to form a plurality of first openings that expose a plurality of channel regions in each of the first semiconductor layers, and a thickness of the second semiconductor layers is limited to be greater than a width of a gap between adjacent two of the plurality of first openings in a horizontal direction, such that when conductive layers are deposited along the first openings by means of an atomic layer deposition process, the conductive layers in the plurality of first openings in the horizontal direction are connected into a line to form a horizontal word line structure. In this way, fabrication processes the three-dimensional memory are simplified, and fabrication yield the three-dimensional memory is increased. In addition, the horizontal word line structure also facilitates reducing a resistance of the three-dimensional memory, thereby improving electrical properties of the three-dimensional memory.

The above merely are embodiments of the present disclosure. It is to be pointed out that to those of ordinary skill in the art, various improvements and embellishments may be made without departing from the principles of the present disclosure, and these improvements and embellishments are also deemed to be within the scope of protection of the present disclosure.

What is claimed is:

1. A three-dimensional memory, comprising:

a substrate;

a stacked layer structure positioned on the substrate, the stacked layer structure comprising a plurality of first semiconductor layers arranged in parallel along a vertical direction perpendicular to a top surface of the substrate, the plurality of first semiconductor layers comprising a plurality of active areas parallel to one another and arranged at intervals along a second direction, each of the plurality of active areas comprising channel regions extending along a first direction, both the first direction and the second direction being directions parallel to the top surface of the substrate, and the first direction intersecting with the second direction; and a plurality of word lines, the plurality of word lines being parallel to one another and arranged at intervals along the vertical direction, each of the plurality of word lines continuously wrapping all the channel regions in a given one of the plurality of first semiconductor layers, and each of the plurality of word lines extending along the second direction; wherein a spacing between every two of the plurality of active areas in the second direction is smaller than a spacing between the every two of the plurality of active areas in the vertical direction;

wherein the plurality of first semiconductor layers further comprise peripheral regions positioned outside the plurality of active areas; and the stacked layer structure further comprises:

second semiconductor layers positioned between the peripheral regions in adjacent two layers of the plurality of first semiconductor layers; and insulating dielectric layers positioned between the plurality of active areas in adjacent two layers of the plurality of first semiconductor layers.

2. The three-dimensional memory according to claim 1, further comprising:
a spacer positioned between adjacent two of the plurality of active areas in each of the plurality of first semiconductor layers, the spacer extending along a direction parallel to the first direction.

3. The three-dimensional memory according to claim 1, wherein each of the insulating dielectric layers further comprises an air gap positioned between adjacent two of the plurality of channel regions.

4. The three-dimensional memory according to claim 1, further comprising:
source regions positioned in the plurality of active areas in the plurality of first semiconductor layers, the source regions extending along the first direction; and
drain regions positioned in the plurality of active areas in the plurality of first semiconductor layers, the drain regions extending along the first direction, the source regions and the drain regions being arranged on opposite two sides of each of the plurality of channel regions along the first direction.

5. The three-dimensional memory according to claim 1, further comprising:
source regions positioned on surfaces of the plurality of first semiconductor layers, projections of the source regions being positioned in the plurality of active areas along the direction perpendicular to the top surface of the substrate; and
drain regions positioned on the surfaces of the plurality of first semiconductor layers, along the direction perpendicular to the top surface of the substrate, projections of the drain regions being positioned in the plurality of active areas, and the projections of the source regions and the projections of the drain regions being arranged on opposite two sides of each of the plurality of channel regions along the first direction.

* * * * *